US009434821B2

(12) United States Patent
Leir et al.

(10) Patent No.: US 9,434,821 B2
(45) Date of Patent: Sep. 6, 2016

(54) POLYDIORGANOSILOXANE POLYOXAMIDE COPOLYMERS

(71) Applicant: 3M INNOVATIVE PROPERTIES COMPANY, St. Paul, MN (US)

(72) Inventors: Charles M. Leir, Ironton, MN (US); Karl E. Benson, St. Paul, MN (US); Richard G. Hansen, Mahtomedi, MN (US); Mark D. Purgett, Oakdale, MN (US); Albert I. Everaerts, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/933,543

(22) Filed: Nov. 5, 2015

(65) Prior Publication Data

US 2016/0053057 A1    Feb. 25, 2016

Related U.S. Application Data

(63) Continuation of application No. 14/471,354, filed on Aug. 28, 2014, now Pat. No. 9,206,290, which is a continuation of application No. 14/058,953, filed on Oct. 21, 2013, now Pat. No. 8,853,323, which is a continuation of application No. 12/979,785, filed on Dec. 28, 2010, now Pat. No. 8,586,668, which is a continuation of application No. 12/362,155, filed on Jan. 29, 2009, now Pat. No. 7,883,652, which is a continuation of application No. 11/317,271, filed on Dec. 23, 2005, now Pat. No. 7,501,184.

(51) Int. Cl.
| | |
|---|---|
| C08G 77/455 | (2006.01) |
| B32B 3/00 | (2006.01) |
| B32B 7/12 | (2006.01) |
| C08G 69/00 | (2006.01) |
| C08G 77/388 | (2006.01) |
| B32B 27/28 | (2006.01) |
| B29C 45/00 | (2006.01) |
| C08G 77/54 | (2006.01) |
| C08L 83/14 | (2006.01) |
| C23C 14/12 | (2006.01) |
| C08L 83/10 | (2006.01) |

(52) U.S. Cl.
CPC ......... *C08G 77/455* (2013.01); *B29C 45/0001* (2013.01); *B32B 3/00* (2013.01); *B32B 7/12* (2013.01); *B32B 27/283* (2013.01); *C08G 69/00* (2013.01); *C08G 77/388* (2013.01); *C08G 77/54* (2013.01); *C08L 83/10* (2013.01); *C08L 83/14* (2013.01); *C23C 14/12* (2013.01); *Y10S 526/935* (2013.01); *Y10T 428/1397* (2015.01); *Y10T 428/24479* (2015.01); *Y10T 428/2982* (2015.01); *Y10T 428/31663* (2015.04)

(58) Field of Classification Search
None
See application file for complete search history.

(56) References Cited

U.S. PATENT DOCUMENTS

| | | | |
|---|---|---|---|
| 3,890,269 | A | 6/1975 | Martin |
| 4,119,615 | A | 10/1978 | Schulze |
| 4,661,577 | A | 4/1987 | Jo Lane |
| 5,026,890 | A | 6/1991 | Webb |
| 5,039,738 | A | 8/1991 | Czech |
| 5,214,119 | A | 5/1993 | Leihr |
| 5,276,122 | A | 1/1994 | Aoki |
| 5,290,615 | A | 3/1994 | Tushaus |
| 5,302,735 | A | 4/1994 | Neri |
| 5,461,134 | A | 10/1995 | Leir |
| 5,512,650 | A | 4/1996 | Leir |
| 5,663,262 | A * | 9/1997 | Shirakawa .......... B01F 17/0035 525/217 |
| 5,981,680 | A | 11/1999 | Petroff |
| 6,051,216 | A | 4/2000 | Barr |
| 6,355,759 | B1 | 3/2002 | Sherman |
| 6,407,195 | B2 | 6/2002 | Sherman |
| 6,441,118 | B2 | 8/2002 | Sherman |
| 6,531,620 | B2 | 3/2003 | Brader |
| 6,531,630 | B2 | 3/2003 | Vidalin |
| 6,664,359 | B1 | 12/2003 | Kangas |
| 6,730,397 | B2 | 5/2004 | Melancon |
| 6,846,893 | B1 | 1/2005 | Sherman |
| 7,371,464 | B2 | 5/2008 | Sherman |
| 7,501,184 | B2 | 3/2009 | Leir |
| 7,705,103 | B2 * | 4/2010 | Sherman .............. C08G 77/455 428/447 |
| 7,820,297 | B2 | 10/2010 | Benson |
| 7,883,652 | B2 | 2/2011 | Leir |
| 7,947,376 | B2 | 5/2011 | Sherman |
| 7,981,995 | B2 | 7/2011 | Hays |

(Continued)

FOREIGN PATENT DOCUMENTS

| | | |
|---|---|---|
| WO | WO 99/28402 | 6/1999 |
| WO | WO 03/052019 | 6/2003 |
| WO | WO 2004/054523 | 7/2004 |

OTHER PUBLICATIONS

Kinning, "Bulk Surface and Interfacial Characterization of Silicone-Polyurea Segmented Copolymers", Journal of Adhesion, 2001, vol. 75, pp. 1-26.

(Continued)

*Primary Examiner* — Marc Zimmer
(74) *Attorney, Agent, or Firm* — Jeffrey M. Olofson

(57) ABSTRACT

Polydiorganosiloxane polyoxamide, linear, block copolymers and methods of making the copolymers are provided. The method of making the copolymers involves reacting a diamine with a precursor having at least one polydiorganosiloxane segment and at least two oxalyamino groups. The polydiorganosiloxane polyoxamide block copolymers are of the $(AB)_n$ type.

18 Claims, No Drawings

(56) References Cited

U.S. PATENT DOCUMENTS

| | | |
|---|---|---|
| 8,067,094 B2 | 11/2011 | Benson |
| 8,124,713 B2 | 2/2012 | Hays |
| 8,236,429 B2 | 8/2012 | Sherman |
| 8,586,668 B2 | 11/2013 | Leir |
| 8,853,323 B2 | 10/2014 | Leir |
| 2003/0165676 A1 | 9/2003 | Zhou |
| 2003/0175510 A1 | 9/2003 | Sherman |
| 2003/0235553 A1 | 12/2003 | Lu |
| 2004/0115153 A1 | 6/2004 | Yu |
| 2004/0120912 A1 | 6/2004 | Yu |
| 2005/0136266 A1 | 6/2005 | Zhou |
| 2007/0149745 A1 | 6/2007 | Leir |
| 2007/0177272 A1 | 8/2007 | Benson |
| 2008/0187750 A1 | 8/2008 | Sherman |
| 2008/0199620 A1 | 8/2008 | Sherman |
| 2010/0221511 A1 | 9/2010 | Benson |

OTHER PUBLICATIONS

McGrath, "Synthesis and Characterization of Segmented Siloxane Copolymers", Polymer Preprints, vol. 39, No. 1, 1998, pp. 455-456.
Search Report for PCT/US2006/047169, 2 pages.

* cited by examiner

POLYDIORGANOSILOXANE POLYOXAMIDE COPOLYMERS

CROSS REFERENCE TO RELATED APPLICATIONS

This application is a continuation of U.S. Ser. No. 14/471,354, filed Aug. 28, 2014, now allowed, which is a continuation of U.S. Ser. No. 14/058,953, filed Oct. 21, 2013, now issued as U.S. Pat. No. 8,853,323 on Oct. 7, 2014, which is a continuation of Ser. No. 12/979,785, filed Dec. 28, 2010, now issued as U.S. Pat. No. 8,586,668 on Nov. 19, 2013, which is a continuation of U.S. Ser. No. 12/362,155, filed Jan. 29, 2009, now issued as U.S. Pat. No. 7,883,652 on Feb. 8, 2011, which is a continuation of U.S. Ser. No. 11/317,271, filed Dec. 23, 2005, now issued as U.S. Pat. No. 7,501,184 on Mar. 10, 2009, the disclosure of which is incorporated by referenced in its entirety herein.

TECHNICAL FIELD

Polydiorganosiloxane polyoxamide copolymers and methods of making the copolymers are described.

BACKGROUND

Siloxane polymers have unique properties derived mainly from the physical and chemical characteristics of the siloxane bond. These properties include low glass transition temperature, thermal and oxidative stability, resistance to ultraviolet radiation, low surface energy and hydrophobicity, high permeability to many gases, and biocompatibility. The siloxane polymers, however, often lack tensile strength.

The low tensile strength of the siloxane polymers can be improved by forming block copolymers. Some block copolymers contain a "soft" siloxane polymeric block or segment and any of a variety of "hard" blocks or segments. Polydiorganosiloxane polyamides and polydiorganosiloxane polyureas are exemplary block copolymers.

Polydiorganosiloxane polyamides have been prepared by condensation reactions of amino terminated silicones with short-chained dicarboxylic acids. Alternatively, these copolymers have been prepared by condensation reactions of carboxy terminated silicones with short-chained diamines. Because polydiorganosiloxanes (e.g., polydimethylsiloxanes) and polyamides often have significantly different solubility parameters, it can be difficult to find reaction conditions for production of siloxane-based polyamides that result in high degrees of polymerization, particularly with larger homologs of the polyorganosiloxane segments. Many of the known siloxane-based polyamide copolymers contain relatively short segments of the polydiorganosiloxane (e.g., polydimethylsiloxane) such as segments having no greater than about 30 diorganosiloxy (e.g., dimethylsiloxy) units or the amount of the polydiorganosiloxane segment in the copolymer is relatively low. That is, the fraction (i.e., amount based on weight) of polydiorganosiloxane (e.g., polydimethylsiloxane) soft segments in the resulting copolymers tends to be low.

Polydiorganosiloxane polyureas are another type of block copolymer. Although these block copolymers have many desirable characteristics, some of them tend to degrade when subjected to elevated temperatures such as 250° C. or higher.

SUMMARY

Polydiorganosiloxane polyoxamide block copolymers and methods of making the copolymers are provided. The methods of making the copolymers involve the use of a precursor that includes at least one polydiorganosiloxane segment and at least two oxalylamino groups. The resulting copolymers have a plurality of oxalylamino and aminoxalylamino groups (e.g., the oxalylamino groups can be part of the aminoxalylamino groups). The polydiorganosiloxane polyoxamide copolymers can contain a relatively large fraction of the polydiorganosiloxane segment compared to many known polydiorganosiloxane polyamide copolymers. The polydiorganosiloxane polyoxamide copolymer can usually be subjected to elevated temperatures up to 250° C. or higher without apparent degradation.

In a first aspect, a copolymeric material is provided that contains at least two repeat units of Formula I.

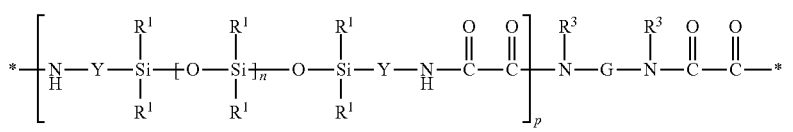

In this formula, each $R^1$ is independently an alkyl, haloalkyl, aralkyl, alkenyl, aryl, or aryl substituted with an alkyl, alkoxy, or halo. Each Y is independently an alkylene, aralkylene, or a combination thereof. Subscript n is independently an integer of 0 to 1500 and subscript p is an integer of 1 to 10. Group G is a divalent group that is the residue unit that is equal to a diamine of formula $R^3HN\text{-}G\text{-}NHR^3$ minus the two $-NHR^3$ groups (i.e., amino groups). Group $R^3$ is hydrogen or alkyl or $R^3$ taken together with G and with the nitrogen to which they are both attached forms a heterocyclic group. Each asterisk indicates the position of attachment of the repeating unit to another group such as another repeat unit.

In a second aspect, a method of making a copolymeric material having at least two repeat units of Formula I is provided. The method includes mixing together under reaction conditions
a) a precursor of Formula II; and

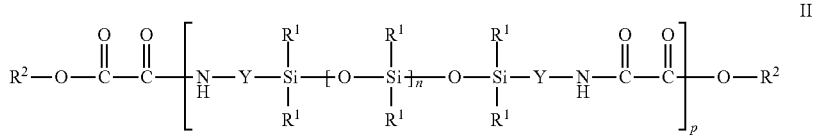

b) a diamine having two primary amino groups, two secondary amino groups, or one primary amino group and one secondary amino group. The diamine is of formula $R^3HN\text{-}G\text{-}NHR^3$ where G is a divalent group that is the residue unit that is equal to a diamine of formula minus the two $-NHR^3$ groups (i.e., amino groups). Group $R^3$ is hydrogen or alkyl or $R^3$ taken together with G and with the nitrogen to which they are both attached forms a heterocyclic group.

In Formula II, each $R^1$ is independently an alkyl, haloalkyl, aralkyl, alkenyl, aryl, or aryl substituted with an alkyl, alkoxy, or halo. Each $R^2$ is independently an alkyl, haloalkyl, aryl, or aryl substituted with an alkyl, alkoxy, halo, or alkoxycarbonyl. Each Y is independently an alkylene, aralkylene, or a combination thereof. The subscript n is independently an integer of 0 to 1500 and the subscript p is an integer of 1 to 10.

In a third aspect, articles are provided that contain a copolymer having at least two repeat units of Formula I.

The above summary of the present invention is not intended to describe each disclosed embodiment or every implementation of the present invention. The description that follows more particularly exemplifies illustrative embodiments. In several places throughout the application, guidance is provided through lists of examples, which can be used in various combinations. In each instance, the recited list serves only as a representative group and should not be interpreted as an exclusive list.

DETAILED DESCRIPTION OF THE INVENTION

Polydiorganosiloxane polyoxamide block copolymers and methods of making the copolymers are provided. The polydiorganosiloxane polyoxamide copolymers, which are of the $(AB)_n$ type, are the condensation reaction product of (a) a diamine having primary or secondary amino groups with (b) a precursor having at least one polydiorganosiloxane segment and at least two oxalylamino groups. The copolymers have many of the desirable features of polysiloxanes such as low glass transition temperatures, thermal and oxidative stability, resistance to ultraviolet radiation, low surface energy and hydrophobicity, and high permeability to many gases. Additionally, the copolymers can have improved mechanical strength and elastomeric properties compared to polysiloxanes. At least some of the copolymers are optically clear, have a low refractive index, or both.

DEFINITIONS

The terms "a", "an", and "the" are used interchangeably with "at least one" to mean one or more of the elements being described.

The term "alkenyl" refers to a monovalent group that is a radical of an alkene, which is a hydrocarbon with at least one carbon-carbon double bond. The alkenyl can be linear, branched, cyclic, or combinations thereof and typically contains 2 to 20 carbon atoms. In some embodiments, the alkenyl contains 2 to 18, 2 to 12, 2 to 10, 4 to 10, 4 to 8, 2 to 8, 2 to 6, or 2 to 4 carbon atoms. Exemplary alkenyl groups include ethenyl, n-propenyl, and n-butenyl.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "alkoxy" refers to a monovalent group of formula $-OR$ where R is an alkyl group.

The term "alkoxycarbonyl" refers to a monovalent group of formula $-(CO)OR$ where R is an alkyl group and (CO) denotes a carbonyl group with the carbon attached to the oxygen with a double bond.

The term "aralkyl" refers to a monovalent group of formula $-R^a\text{-}Ar$ where $R^a$ is an alkylene and Ar is an aryl group. That is, the aralkyl is an alkyl substituted with an aryl. The term "aralkylene" refers to a divalent group of formula $-R^a\text{-}Ar^a-$ where $R^a$ is an alkylene and $Ar^a$ is an arylene (i.e., an alkylene is bonded to an arylene).

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The term "aryloxy" refers to a monovalent group of formula $-OAr$ where Ar is an aryl group.

The term "carbonyl" refers to a divalent group of formula $-(CO)-$ where the carbon atom is attached to the oxygen atom with a double bond.

The term "halo" refers to fluoro, chloro, bromo, or iodo.

The term "haloalkyl" refers to an alkyl having at least one hydrogen atom replaced with a halo. Some haloalkyl groups are fluoroalkyl groups, chloroalkyl groups, or bromoalkyl groups.

The term "heteroalkylene" refers to a divalent group that includes at least two alkylene groups connected by a thio, oxy, or —NR— where R is alkyl. The heteroalkylene can be linear, branched, cyclic, or combinations thereof and can include up to 60 carbon atoms and up to 15 heteroatoms. In some embodiments, the heteroalkylene includes up to 50 carbon atoms, up to 40 carbon atoms, up to 30 carbon atoms, up to 20 carbon atoms, or up to 10 carbon atoms. Some heteroalkylenes are polyalkylene oxides where the heteroatom is oxygen.

The term "oxalyl" refers to a divalent group of formula —(CO)—(CO)— where each (CO) denotes a carbonyl group.

The terms "oxalylamino" and "aminoxalyl" are used interchangeably to refer to a divalent group of formula —(CO)—(CO)—NH— where each (CO) denotes a carbonyl.

The term "aminoxalylamino" refers to a divalent group of formula —NH—(CO)—(CO)—NR$^d$— where each (CO) denotes a carbonyl group and R$^d$ is hydrogen, alkyl, or part of a heterocyclic group along with the nitrogen to which they are both attached. In most embodiments, R$^d$ is hydrogen or alkyl. In many embodiments, R$^d$ is hydrogen.

The terms "polymer" and "polymeric material" refer to both materials prepared from one monomer such as a homopolymer or to materials prepared from two or more monomers such as a copolymer, terpolymer, or the like. Likewise, the term "polymerize" refers to the process of making a polymeric material that can be a homopolymer, copolymer, terpolymer, or the like. The terms "copolymer" and "copolymeric material" refer to a polymeric material prepared from at least two monomers.

The term "polydiorganosiloxane" refers to a divalent segment of formula

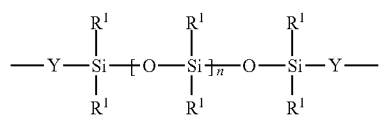

where each R$^1$ is independently an alkyl, haloalkyl, aralkyl, alkenyl, aryl, or aryl substituted with an alkyl, alkoxy, or halo; each Y is independently an alkylene, aralkylene, or a combination thereof; and subscript n is independently an integer of 0 to 1500.

The terms "room temperature" and "ambient temperature" are used interchangeably to mean temperatures in the range of 20° C. to 25° C.

Unless otherwise indicated, all numbers expressing feature sizes, amounts, and physical properties used in the specification and claims are to be understood as being modified in all instances by the term "about." Accordingly, unless indicated to the contrary, the numbers set forth are approximations that can vary depending upon the desired properties using the teachings disclosed herein.

Compounds and Compositions

A linear, polydiorganosiloxane polyoxamide block copolymer is provided that contains at least two repeat units of Formula I.

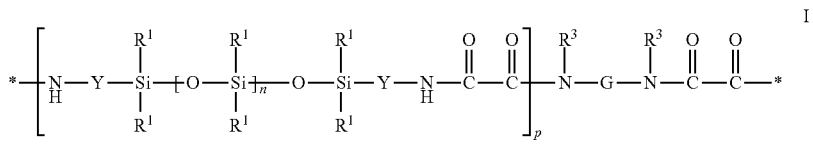

In this formula, each R$^1$ is independently an alkyl, haloalkyl, aralkyl, alkenyl, aryl, or aryl substituted with an alkyl, alkoxy, or halo. Each Y is independently an alkylene, aralkylene, or a combination thereof. Subscript n is independently an integer of 0 to 1500 and the subscript p is an integer of 1 to 10. Group G is a divalent group that is the residue unit that is equal to a diamine of formula R$^3$HN-G-NHR$^3$ minus the two —NHR$^3$ groups. Group R$^3$ is hydrogen or alkyl (e.g., an alkyl having 1 to 10, 1 to 6, or 1 to 4 carbon atoms) or R$^3$ taken together with G and with the nitrogen to which they are both attached forms a heterocyclic group (e.g., R$^3$HN-G-NHR$^3$ is piperazine or the like). Each asterisk (*) indicates a site of attachment of the repeat unit to another group in the copolymer such as, for example, another repeat unit of Formula I.

Suitable alkyl groups for R$^1$ in Formula I typically have 1 to 10, 1 to 6, or 1 to 4 carbon atoms. Exemplary alkyl groups include, but are not limited to, methyl, ethyl, isopropyl, n-propyl, n-butyl, and iso-butyl. Suitable haloalkyl groups for R$^1$ often have only a portion of the hydrogen atoms of the corresponding alkyl group replaced with a halogen. Exemplary haloalkyl groups include chloroalkyl and fluoroalkyl groups with 1 to 3 halo atoms and 3 to 10 carbon atoms. Suitable alkenyl groups for R$^1$ often have 2 to 10 carbon atoms. Exemplary alkenyl groups often have 2 to 8, 2 to 6, or 2 to 4 carbon atoms such as ethenyl, n-propenyl, and n-butenyl. Suitable aryl groups for R$^1$ often have 6 to 12 carbon atoms. Phenyl is an exemplary aryl group. The aryl group can be unsubstituted or substituted with an alkyl (e.g., an alkyl having 1 to 10 carbon atoms, 1 to 6 carbon atoms, or 1 to 4 carbon atoms), an alkoxy (e.g., an alkoxy having 1 to 10 carbon atoms, 1 to 6 carbon atoms, or 1 to 4 carbon atoms), or halo (e.g., chloro, bromo, or fluoro). Suitable aralkyl groups for R$^1$ usually have an alkylene group with 1 to 10 carbon atoms and an aryl group with 6 to 12 carbon atoms. In some exemplary aralkyl groups, the aryl group is phenyl and the alkylene group has 1 to 10 carbon atoms, 1 to 6 carbon atoms, or 1 to 4 carbon atoms (i.e., the structure of the aralkyl is alkylene-phenyl where an alkylene is bonded to a phenyl group).

In some repeat units of Formula I, at least 50 percent of the R$^1$ groups are methyl. For example, at least 60 percent, at least 70 percent, at least 80 percent, at least 90 percent, at least 95 percent, at least 98 percent, or at least 99 percent of the R$^1$ groups can be methyl. The remaining R$^1$ groups can be selected from an alkyl having at least two carbon atoms, haloalkyl, aralkyl, alkenyl, aryl, or aryl substituted with an alkyl, alkoxy, or halo.

Each Y in Formula I is independently an alkylene, aralkylene, or a combination thereof. Suitable alkylene groups typically have up to 10 carbon atoms, up to 8 carbon atoms, up to 6 carbon atoms, or up to 4 carbon atoms. Exemplary alkylene groups include methylene, ethylene, propylene, butylene, and the like. Suitable aralkylene groups usually have an arylene group with 6 to 12 carbon atoms bonded to an alkylene group with 1 to 10 carbon atoms. In some exemplary aralkylene groups, the arylene portion is phenylene. That is, the divalent aralkylene group is phenylene-alkylene where the phenylene is bonded to an alkylene having 1 to 10, 1 to 8, 1 to 6, or 1 to 4 carbon atoms. As used herein with reference to group Y, "a combination thereof" refers to a combination of two or more groups selected from an alkylene and aralkylene group. A combination can be, for example, a single aralkylene bonded to a single alkylene (e.g., alkylene-arylene-alkylene). In one exemplary alkylene-arylene-alkylene combination, the arylene is phenylene and each alkylene has 1 to 10, 1 to 6, or 1 to 4 carbon atoms.

Each subscript n in Formula I is independently an integer of 0 to 1500. For example, subscript n can be an integer up to 1000, up to 500, up to 400, up to 300, up to 200, up to 100, up to 80, up to 60, up to 40, up to 20, or up to 10. The value of n is often at least 1, at least 2, at least 3, at least 5, at least 10, at least 20, or at least 40. For example, subscript n can be in the range of 40 to 1500, 0 to 1000, 40 to 1000, 0 to 500, 1 to 500, 40 to 500, 1 to 400, 1 to 300, 1 to 200, 1 to 100, 1 to 80, 1 to 40, or 1 to 20.

The subscript p is an integer of 1 to 10. For example, the value of p is often an integer up to 9, up to 8, up to 7, up to 6, up to 5, up to 4, up to 3, or up to 2. The value of p can be in the range of 1 to 8, 1 to 6, or 1 to 4.

Group G in Formula I is a residual unit that is equal to a diamine compound of formula $R^3HN$-G-$NHR^3$ minus the two amino groups (i.e., $-NHR^3$ groups). The diamine can have primary or secondary amino groups. Group $R^3$ is hydrogen or alkyl (e.g., an alkyl having 1 to 10, 1 to 6, or 1 to 4 carbon atoms) or $R^3$ taken together with G and with the nitrogen to which they are both attached forms a heterocyclic group (e.g., $R^3HN$-G-$NHR^3$ is piperazine). In most embodiments, $R^3$ is hydrogen or an alkyl. In many embodiments, both of the amino groups of the diamine are primary amino groups (i.e., both $R^3$ groups are hydrogen) and the diamine is of formula $H_2N$-G-$NH_2$.

In some embodiments, G is an alkylene, heteroalkylene, polydiorganosiloxane, arylene, aralkylene, or a combination thereof. Suitable alkylenes often have 2 to 10, 2 to 6, or 2 to 4 carbon atoms. Exemplary alkylene groups include ethylene, propylene, butylene, and the like. Suitable heteroalkylenes are often polyoxyalkylenes such as polyoxyethylene having at least 2 ethylene units, polyoxypropylene having at least 2 propylene units, or copolymers thereof. Suitable polydiorganosiloxanes include the polydiorganosiloxane diamines of Formula III, which are described below, minus the two amino groups. Exemplary polydiorganosiloxanes include, but are not limited to, polydimethylsiloxanes with alkylene Y groups. Suitable aralkylene groups usually contain an arylene group having 6 to 12 carbon atoms bonded to an alkylene group having 1 to 10 carbon atoms. Some exemplary aralkylene groups are phenylene-alkylene where the phenylene is bonded to an alkylene having 1 to 10 carbon atoms, 1 to 8 carbon atoms, 1 to 6 carbon atoms, or 1 to 4 carbon atoms. As used herein with reference to group G, "a combination thereof" refers to a combination of two or more groups selected from an alkylene, heteroalkylene, polydiorganosiloxane, arylene, and aralkylene. A combination can be, for example, an aralkylene bonded to an alkylene (e.g., alkylene-arylene-alkylene). In one exemplary alkylene-arylene-alkylene combination, the arylene is phenylene and each alkylene has 1 to 10, 1 to 6, or 1 to 4 carbon atoms.

The polydiorganosiloxane polyoxamide tends to be free of groups having a formula $-R^a-(CO)-NH-$ where $R^a$ is an alkylene. All of the carbonylamino groups along the backbone of the copolymeric material are part of an oxalylamino group (i.e., the $-(CO)-(CO)-NH-$ group). That is, any carbonyl group along the backbone of the copolymeric material is bonded to another carbonyl group and is part of an oxalyl group. More specifically, the polydiorganosiloxane polyoxamide has a plurality of aminoxalylamino groups.

The polydiorganosiloxane polyoxamide is a linear, block copolymer and can be an elastomeric material. Unlike many of the known polydiorganosiloxane polyamides that are generally formulated as brittle solids or hard plastics, the polydiorganosiloxane polyoxamides can be formulated to include greater than 50 weight percent polydiorganosiloxane segments based on the weight of the copolymer. The weight percent of the diorganosiloxane in the polydiorganosiloxane polyoxamides can be increased by using higher molecular weight polydiorganosiloxanes segments to provide greater than 60 weight percent, greater than 70 weight percent, greater than 80 weight percent, greater than 90 weight percent, greater than 95 weight percent, or greater than 98 weight percent of the polydiorganosiloxane segments in the polydiorganosiloxane polyoxamides. Higher amounts of the polydiorganosiloxane can be used to prepare elastomeric materials with lower modulus while maintaining reasonable strength.

Some of the polydiorganosiloxane polyoxamides can be heated to a temperature up to 200° C., up to 225° C., up to 250° C., up to 275° C., or up to 300° C. without noticeable degradation of the material. For example, when heated in a thermogravimetric analyzer in the presence of air, the copolymers often have less than a 10 percent weight loss when scanned at a rate 50° C. per minute in the range of 20° C. to about 350° C. Additionally, the copolymers can often be heated at a temperature such as 250° C. for 1 hour in air without apparent degradation as determined by no detectable loss of mechanical strength upon cooling.

The copolymeric material of Formula I can be optically clear. As used herein, the term "optically clear" refers to a material that is clear to the human eye. An optically clear copolymeric material often has a luminous transmission of at least about 90 percent, a haze of less than about 2 percent, and opacity of less than about 1 percent in the 400 to 700 nm wavelength range. Both the luminous transmission and the haze can be determined using, for example, the method of ASTM-D 1003-95.

Additionally, the copolymeric material of Formula I can have a low refractive index. As used herein, the term "refractive index" refers to the absolute refractive index of a material (e.g., copolymeric material) and is the ratio of the speed of electromagnetic radiation in free space to the speed of the electromagnetic radiation in the material of interest. The electromagnetic radiation is white light. The index of refraction is measured using an Abbe refractometer, available commercially, for example, from Fisher Instruments of Pittsburgh, Pa. The measurement of the refractive index can depend, to some extent, on the particular refractometer used. The copolymeric material usually has a refractive index in the range of about 1.41 to about 1.50.

Optionally, non-reactive additives such as fillers, pigments, stabilizers, antioxidants, flame retardants, compatibilizers, and the like can be added to the copolymeric materials.

The polydiorganosilocane polyoxamides are soluble in many common organic solvents such as, for example, toluene, tetrahydrofuran, dichloromethane, aliphatic hydrocarbons (e.g., alkanes such as hexane), or mixtures thereof.

The polydiorganosiloxane polyoxamides can be cast from solvents as film, molded or embossed in various shapes, or extruded into films. The high temperature stability of the copolymeric material makes them well suited for extrusion methods of film formation. The films can be optically clear. A multilayer film containing the polydiorganosiloxane polyoxamide block copolymers is further described in copending patent application 60/753,791 filed on the same day as the present application, incorporated herein by reference in its entirety.

Various articles are provided that contain a polydiorganosiloxane polyoxamide copolymer having at least two repeat units of Formula I. The article, for example, can include a layer containing the polydiorganosiloxane polyoxamide copolymer and one or more optional substrates. For example, the polydiorganosiloxane polyoxamide copolymer can be in a layer adjacent to a first substrate or positioned between a first substrate and a second substrate. That is, the article can be arranged in the following order: a first substrate, a layer containing the polydiorganosiloxane polyoxamide copolymer, and a second substrate. As used herein, the term "adjacent" refers to a first layer that contacts a second layer or that is positioned in proximity to the second layer but separated from the second layer by one or more additional layers.

The polydiorganosiloxane polyoxamides can be formulated into adhesive compositions such as pressure sensitive adhesives and heat activated adhesives that contain a tackifier. Such adhesive compositions are further described in copending patent application Ser. No. 11/317,602 filed on the same day as the present application, incorporated herein by reference in its entirety.

Additionally, the polydiorganosiloxane polyoxamides can be used as a hot melt adhesive. Typically, the hot melt adhesive contains little or no tackifier. The hot melt adhesives can be used, for example, to bond two surfaces together into a composite. That is, the hot melt adhesive can be used to bond a first substrate to a second substrate with the hot melt adhesive positioned between the first and second substrates. During application to a surface such as the surface of a substrate, hot melt adhesives are desirably sufficiently fluid to wet the surface completely and leave no voids, even if the surface is rough. Such an adhesive composition typically has a low viscosity at the time of application and then sets into a solid upon cooling. The cohesive strength develops upon cooling. Alternatively, the hot melt adhesive composition can be formulated with a solvent or carrier that lowers the viscosity sufficiently to permit wetting of the surface. The solvent or carrier can then be removed to provide a solid coating having cohesive strength.

Methods of Making Polydiorganosiloxane Polyoxamide Copolymers

The linear block copolymers having repeat units of Formula I can be prepared, for example, as represented in Reaction Scheme A.

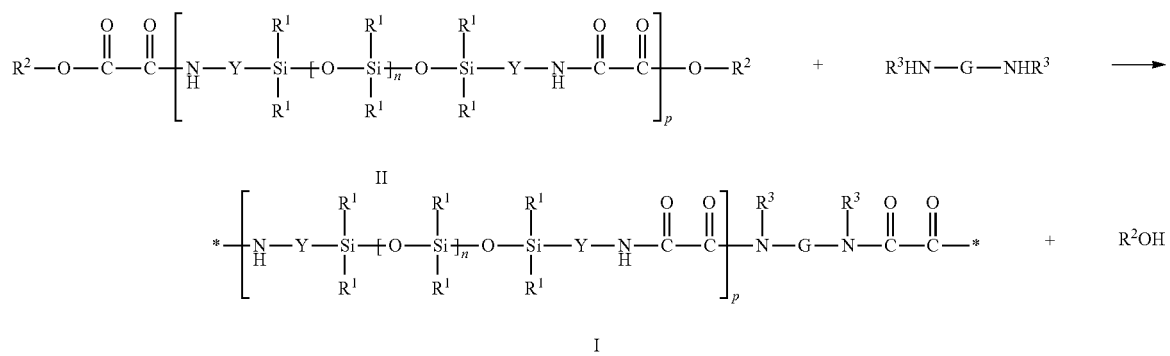

In this reaction scheme, a precursor of Formula II is combined under reaction conditions with a diamine having two primary or secondary amino groups, two secondary amino groups, or one primary amino group and one secondary amino group. The diamine is usually of formula $R^3HN$-G-$NHR^3$. The $R^2OH$ by-product is typically removed from the resulting polydiorganosiloxane polyoxamide.

The diamine $R^3HN$-G-$NHR^3$ in Reaction Scheme A has two amino groups (i.e., —$NHR^3$). Group $R^3$ is hydrogen or alkyl (e.g., an alkyl having 1 to 10, 1 to 6, or 1 to 4 carbon atoms) or $R^3$ taken together with G and with the nitrogen to which they are both attached forms a heterocyclic group (e.g., the diamine is piperazine or the like). In most embodiments, $R^3$ is hydrogen or alkyl. In many embodiments, the diamine has two primary amino groups (i.e., each $R^3$ group is hydrogen) and the diamine is of formula $H_2N$-G-$NH_2$. The portion of the diamine exclusive of the two amino groups is referred to as group G in Formula I.

The diamines are sometimes classified as organic diamines or polydiorganosiloxane diamines with the organic diamines including, for example, those selected from alkylene diamines, heteroalkylene diamines, arylene diamines, aralkylene diamines, or alkylene-aralkylene diamines. The diamine has only two amino groups so that the resulting polydiorganosiloxane polyoxamides are linear block copolymers that are often elastomeric, molten at elevated temperatures, and soluble in some common organic solvents. The diamine is free of a polyamine having more than two primary or secondary amino groups. Tertiary amines that do not react with the precursor of Formula II can be present. Additionally, the diamine is free of any carbonylamino group. That is, the diamine is not an amide.

Exemplary polyoxyalkylene diamines (i.e., G is a heteroalkylene with the heteroatom being oxygen) include, but are not limited to, those commercially available from Huntsman, The Woodlands, Tex. under the trade designation JEFFAMINE D-230 (i.e., polyoxypropylene diamine having an average molecular weight of about 230 g/mole), JEFFAMINE D-400 (i.e., polyoxypropylene diamine having an average molecular weight of about 400 g/mole), JEFFAMINE D-2000 (i.e., polyoxypropylene diamine having an average molecular weight of about 2,000 g/mole), JEFFAMINE HK-511 (i.e., polyetherdiamine with both oxyethylene and oxypropylene groups and having an average molecular weight of about 220 g/mole), JEFFAMINE ED-2003 (i.e., polypropylene oxide capped polyethylene glycol having an average molecular weight of about 2,000 g/mole), and JEFFAMINE EDR-148 (i.e., triethyleneglycol diamine).

Exemplary alkylene diamines (i.e., G is a alkylene) include, but are not limited to, ethylene diamine, propylene diamine, butylene diamine, hexamethylene diamine, 2-methylpentamethylene 1,5-diamine (i.e., commercially available from DuPont, Wilmington, Del. under the trade designation DYTEK A), 1,3-pentane diamine (commercially available from DuPont under the trade designation DYTEK EP), 1,4-cyclohexane diamine, 1,2-cyclohexane diamine (commercially available from DuPont under the trade designation DHC-99), 4,4'-bis(aminocyclohexyl)methane, and 3-aminomethyl-3,5,5-trimethylcyclohexylamine.

Exemplary arylene diamines (i.e., G is an arylene such as phenylene) include, but are not limited to, m-phenylene diamine, o-phenylene diamine, and p-phenylene diamine. Exemplary aralkylene diamines (i.e., G is an aralkylene such as alkylene-phenyl) include, but are not limited to 4-aminomethyl-phenylamine, 3-aminomethyl-phenylamine, and 2-aminomethyl-phenylamine. Exemplary alkylene-aralkylene diamines (i.e., G is an alkylene-aralkylene such as alkylene-phenylene-alkylene) include, but are not limited to, 4-aminomethyl-benzylamine, 3-aminomethyl-benzylamine, and 2-aminomethyl-benzylamine.

The precursor of Formula II in Reaction Scheme A has at least one polydiorganosiloxane segment and at least two oxalylamino groups. Group $R^1$, group Y, subscript n, and subscript p are the same as described for Formula I. Each group $R^2$ is independently an alkyl, haloalkyl, aryl, or aryl substituted with an alkyl, alkoxy, halo, or alkoxycarbonyl. The precursor of Formula II can include a single compound (i.e., all the compounds have the same value of p and n) or can include a plurality of compounds (i.e., the compounds have different values for p, different values for n, or different values for both p and n). Precursors with different n values have siloxane chains of different length. Precursors having a p value of at least 2 are chain extended.

In some embodiments, the precursor is a mixture of a first compound of Formula II with subscript p equal to 1 and a second compound of Formula II with subscript p equal to at least 2. The first compound can include a plurality of different compounds with different values of n. The second compound can include a plurality of compounds with different values of p, different values of n, or different values of both p and n. Mixtures can include at least 50 weight percent of the first compound of Formula II (i.e., p is equal to 1) and no greater than 50 weight percent of the second compound of Formula II (i.e., p is equal to at least 2) based on the sum of the weight of the first and second compounds in the mixture. In some mixtures, the first compound is present in an amount of at least 55 weight percent, at least 60 weight percent, at least 65 weight percent, at least 70 weight percent, at least 75 weight percent, at least 80 weight percent, at least 85 weight percent, at least 90 weight percent, at least 95 weight percent, or at least 98 weight percent based on the total amount of the compounds of Formula II. The mixtures often contain no greater than 50 weight percent, no greater than 45 weight percent, no greater than 40 weight percent, no greater than 35 weight percent, no greater than 30 weight percent, no greater than 25 weight percent, no greater than 20 weight percent, no greater than 15 weight percent, no greater than 10 weight percent, no greater than 5 weight percent, or no greater than 2 weight percent of the second compound.

Different amounts of the chain-extended precursor of Formula II in the mixture can affect the final properties of the elastomeric material of Formula I. That is, the amount of the second compound of Formula II (i.e., p equal to at least 2) can be varied advantageously to provide elastomeric materials with a range of properties. For example, a higher amount of the second compound of Formula II can alter the melt rheology (e.g., the elastomeric material can flow easier when present as a melt), alter the softness of the elastomeric material, lower the modulus of the elastomeric material, or a combination thereof.

Reaction Scheme A can be conducted using a plurality of precursors of Formula II, a plurality of diamines, or a combination thereof. A plurality of precursors having different average molecular weights can be combined under reaction conditions with a single diamine or with multiple diamines. For example, the precursor of Formula II may include a mixture of materials with different values of n, different values of p, or different values of both n and p. The multiple diamines can include, for example, a first diamine that is an organic diamine and a second diamine that is a polydiorganosiloxane diamine. Likewise, a single precursor can be combined under reaction conditions with multiple diamines.

The molar ratio of the precursor of Formula II to the diamine is often about 1:1. For example, the molar ratio is often less than or equal to 1:0.80, less than or equal to 1:0.85, less than or equal to 1:0.90, less than or equal to 1:0.95, or less than or equal to 1:1. The molar ratio is often greater than or equal to 1:1.05, greater than or equal to 1:1.10, or greater than or equal to 1:1.15. For example, the molar ratio can be in the range of 1:0.80 to 1:1.20, in the range of 1:0.80 to 1:1.15, in the range of 1:0.80 to 1:1.10, in the range of 1:0.80 to 1:1.05, in the range of 1:0.90 to 1:1.10, or in the range of 1:0.95 to 1:1.05. Varying the molar ratio can be used, for example, to alter the overall molecular weight, which can effect the rheology of the resulting copolymers. Additionally, varying the molar ratio can be used to provide oxalylamino-containing end groups or amino end groups, depending upon which reactant is present in molar excess.

The condensation reaction of the precursor of Formula II with the diamine (i.e., Reaction Scheme A) are often conducted at room temperature or at elevated temperatures such as at temperatures up to about 250° C. For example, the reaction often can be conducted at room temperature or at temperatures up to about 100° C. In other examples, the reaction can be conducted at a temperature of at least 100° C., at least 120° C., or at least 150° C. For example, the reaction temperature is often in the range of 100° C. to 220° C., in the range of 120° C. to 220° C., or in the range of 150° C. to 200° C. The condensation reaction is often complete in less than 1 hour, in less than 2 hours, in less than 4 hours, in less than 8 hours, or in less than 12 hours.

Reaction Scheme A can occur in the presence or absence of a solvent. Suitable solvents usually do not react with any of the reactants or products of the reactions. Additionally, suitable solvents are usually capable of maintaining all the reactants and all of the products in solution throughout the polymerization process. Exemplary solvents include, but are not limited to, toluene, tetrahydrofuran, dichloromethane, aliphatic hydrocarbons (e.g., alkanes such as hexane), or mixtures thereof.

Any solvent that is present can be stripped from the resulting polydiorganosiloxane polyoxamide at the completion of the reaction. Solvents that can be removed under the same conditions used to remove the alcohol by-product are often preferred. The stripping process is often conducted at a temperature of at least 100° C., at least 125° C., or at least 150° C. The stripping process is typically at a temperature less than 300° C., less than 250° C., or less than 225° C.

Conducting Reaction Scheme A in the absence of a solvent can be desirable because only the volatile by-product, $R^2OH$, needs to be removed at the conclusion of the reaction. Additionally, a solvent that is not compatible with both reactants and the product can result in incomplete reaction and a low degree of polymerization.

Any suitable reactor or process can be used to prepare the copolymeric material according to Reaction Scheme A. The reaction can be conducted using a batch process, semi-batch process, or a continuous process. Exemplary batch processes can be conducted in a reaction vessel equipped with a mechanical stirrer such as a Brabender mixer, provided the product of the reaction is in a molten state has a sufficiently low viscosity to be drained from the reactor. Exemplary semi-batch process can be conducted in a continuously stirred tube, tank, or fluidized bed. Exemplary continuous processes can be conducted in a single screw or twin screw extruder such as a wiped surface counter-rotating or co-rotating twin screw extruder.

In many processes, the components are metered and then mixed together to form a reaction mixture. The components can be metered volumetrically or gravimetrically using, for example, a gear, piston or progressing cavity pump. The components can be mixed using any known static or dynamic method such as, for example, static mixers, or compounding mixers such as single or multiple screw extruders. The reaction mixture can then be formed, poured, pumped, coated, injection molded, sprayed, sputtered, atomized, stranded or sheeted, and partially or completely polymerized. The partially or completely polymerized material can then optionally be converted to a particle, droplet, pellet, sphere, strand, ribbon, rod, tube, film, sheet, coextruded film, web, non-woven, microreplicated structure, or other continuous or discrete shape, prior to the transformation to solid polymer. Any of these steps can be conducted in the presence or absence of applied heat. In one exemplary process, the components can be metered using a gear pump, mixed using a static mixer, and injected into a mold prior to solidification of the polymerizing material.

The polydiorganosiloxane-containing precursor of Formula II in Reaction Scheme A can be prepared by any known method. In some embodiments, this precursor is prepared according to Reaction Scheme B.

Reaction Scheme B

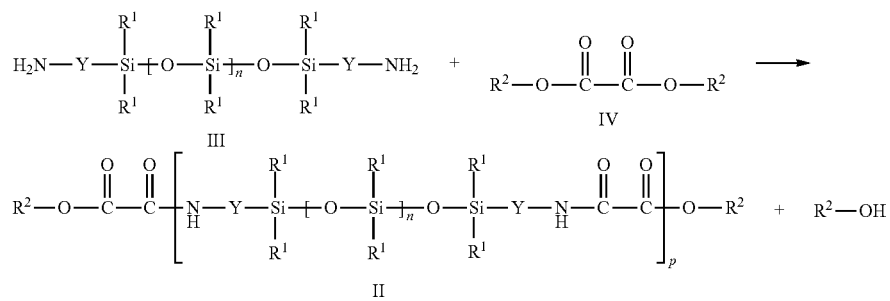

A polydiorganosiloxane diamine of Formula III (p moles) is reacted with a molar excess of an oxalate of Formula IV (greater than p+1 moles) under an inert atmosphere to produce the polydiorganosiloxane-containing precursor of Formula II and $R^2$—OH by-product. In this reaction, $R^1$, Y, n, and p are the same as previously described for Formula I. Each $R^2$ in Formula IV is independently an alkyl, haloalkyl, aryl, or aryl substituted with an alkyl, alkoxy, halo, or alkoxycarbonyl. The preparation of the precursor of Formula II according to Reaction Scheme B is further described in copending patent application with Ser. No. 11/317,616 filed on the same day as the present application, incorporated herein by reference in its entirety.

The polydiorganosiloxane diamine of Formula III in Reaction Scheme B can be prepared by any known method and can have any suitable molecular weight, such as an average molecular weight in the range of 700 to 150,000 g/mole. Suitable polydiorganosiloxane diamines and methods of making the polydiorganosiloxane diamines are described, for example, in U.S. Pat. No. 3,890,269 (Martin), U.S. Pat. No. 4,661,577 (Jo Lane et al.), U.S. Pat. No. 5,026,890 (Webb et al.), U.S. Pat. No. 5,276,122 (Aoki et al.), U.S. Pat. No. 5,214,119 (Leir et al.), U.S. Pat. No. 5,461,134 (Leir et al.), U.S. Pat. No. 5,512,650 (Leir et al.), and U.S. Pat. No. 6,355,759 (Sherman et al.), incorporated herein by reference in their entirety. Some polydiorganosiloxane diamines are commercially available, for example, from Shin Etsu Silicones of America, Inc., Torrance, Calif. and from Gelest Inc., Morrisville, Pa.

A polydiorganosiloxane diamine having a molecular weight greater than 2,000 g/mole or greater than 5,000 g/mole can be prepared using the methods described in U.S. Pat. No. 5,214,119 (Leir et al.), U.S. Pat. No. 5,461,134 (Leir et al.), and U.S. Pat. No. 5,512,650 (Leir et al.). One of the described methods involves combining under reaction conditions and under an inert atmosphere (a) an amine functional end blocker of the following formula

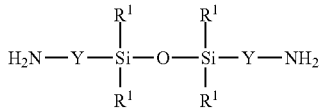

where Y and $R^1$ are the same as defined for Formula I; (b) sufficient cyclic siloxane to react with the amine functional end blocker to form a polydiorganosiloxane diamine having a molecular weight less than 2,000 g/mole; and (c) an anhydrous aminoalkyl silanolate catalyst of the following formula

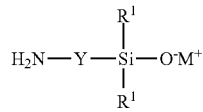

where Y and $R^1$ are the same as defined in Formula I and $M^+$ is a sodium ion, potassium ion, cesium ion, rubidium ion, or tetramethylammonium ion. The reaction is continued until substantially all of the amine functional end blocker is consumed and then additional cyclic siloxane is added to increase the molecular weight. The additional cyclic siloxane is often added slowly (e.g., drop wise). The reaction temperature is often conducted in the range of 80° C. to 90° C. with a reaction time of 5 to 7 hours. The resulting polydiorganosiloxane diamine can be of high purity (e.g., less than 2 weight percent, less than 1.5 weight percent, less than 1 weight percent, less than 0.5 weight percent, less than 0.1 weight percent, less than 0.05 weight percent, or less than 0.01 weight percent silanol impurities). Altering the ratio of the amine end functional blocker to the cyclic siloxane can be used to vary the molecular weight of the resulting polydiorganosiloxane diamine of Formula III.

Another method of preparing the polydiorganosiloxane diamine of Formula III includes combining under reaction conditions and under an inert environment (a) an amine functional end blocker of the following formula

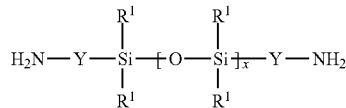

where $R^1$ and Y are the same as described for Formula I and where the subscript x is equal to an integer of 1 to 150; (b) sufficient cyclic siloxane to obtain a polydiorganosiloxane diamine having an average molecular weight greater than the average molecular weight of the amine functional end blocker; and (c) a catalyst selected from cesium hydroxide, cesium silanolate, rubidium silanolate, cesium polysiloxanolate, rubidium polysiloxanolate, and mixtures thereof. The reaction is continued until substantially all of the amine functional end blocker is consumed. This method is further described in U.S. Pat. No. 6,355,759 B1 (Sherman et al.). This procedure can be used to prepare any molecular weight of the polydiorganosiloxane diamine.

Yet another method of preparing the polydiorganosiloxane diamine of Formula III is described in U.S. Pat. No. 6,531,620 B2 (Brader et al.). In this method, a cyclic silazane is reacted with a siloxane material having hydroxy end groups as shown in the following reaction.

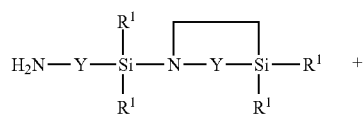

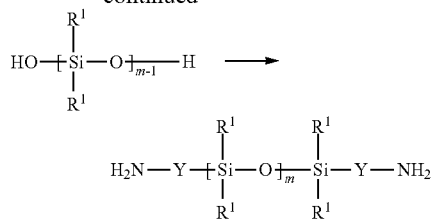

The groups $R^1$ and Y are the same as described for Formula I. The subscript m is an integer greater than 1.

Examples of polydiorganosiloxane diamines include, but are not limited to, polydimethylsiloxane diamine, polydiphenylsiloxane diamine, polytrifluoropropylmethylsiloxane diamine, polyphenylmethylsiloxane diamine, polydiethylsiloxane diamine, polydivinylsiloxane diamine, polyvinylmethylsiloxane diamine, poly(5-hexenyl)methylsiloxane diamine, and mixtures thereof.

In Reaction Scheme B, an oxalate of Formula IV is reacted with the polydiorganosiloxane diamine of Formula III under an inert atmosphere. The two $R^2$ groups in the oxalate of Formula IV can be the same or different. In some methods, the two $R^2$ groups are different and have different reactivity with the polydiorganosiloxane diamine of Formula III in Reaction Scheme B.

Group $R^2$ can be an alkyl, haloalkyl, aryl, or aryl substituted with an alkyl, alkoxy, halo, or alkoxycarbonyl. Suitable alkyl and haloalkyl groups for $R^2$ often have 1 to 10, 1 to 6, or 1 to 4 carbon atoms. Although tertiary alkyl (e.g., tert-butyl) and haloalkyl groups can be used, there is often a primary or secondary carbon atom attached directly (i.e., bonded) to the adjacent oxy group. Exemplary alkyl groups include methyl, ethyl, n-propyl, iso-propyl, n-butyl, and iso-butyl. Exemplary haloalkyl groups include chloroalkyl groups and fluoroalkyl groups in which some, but not all, of the hydrogen atoms on the corresponding alkyl group are replaced with halo atoms. For example, the chloroalkyl or a fluoroalkyl groups can be chloromethyl, 2-chloroethyl, 2,2, 2-trichloroethyl, 3-chloropropyl, 4-chlorobutyl, fluoromethyl, 2-fluoroethyl, 2,2,2-trifluoroethyl, 3-fluoropropyl, 4-fluorobutyl, and the like. Suitable aryl groups for $R^2$ include those having 6 to 12 carbon atoms such as, for example, phenyl. An aryl group can be unsubstituted or substituted with an alkyl (e.g., an alkyl having 1 to 4 carbon atoms such as methyl, ethyl, or n-propyl), an alkoxy (e.g., an alkoxy having 1 to 4 carbon atoms such as methoxy, ethoxy, or propoxy), halo (e.g., chloro, bromo, or fluoro), or alkoxycarbonyl (e.g., an alkoxycarbonyl having 2 to 5 carbon atoms such as methoxycarbonyl, ethoxycarbonyl, or propoxycarbonyl).

The oxalates of Formula IV in Reaction Scheme B can be prepared, for example, by reaction of an alcohol of formula $R^2$—OH with oxalyl dichloride. Commercially available oxalates of Formula IV (e.g., from Sigma-Aldrich, Milwaukee, Wis. and from VWR International, Bristol, Conn.) include, but are not limited to, dimethyl oxalate, diethyl oxalate, di-n-butyl oxalate, di-tert-butyl oxalate, bis(phenyl) oxalate, bis(pentafluorophenyl) oxalate, 1-(2,6-difluorophenyl)-2-(2,3,4,5,6-pentachlorophenyl) oxalate, and bis (2,4,6-trichlorophenyl) oxalate.

A molar excess of the oxalate is used in Reaction Scheme B. That is, the molar ratio of oxalate to polydiorganosiloxane diamine is greater than the stoichiometric molar ratio, which is (p+1): p. The molar ratio is often greater than 2:1, greater than 3:1, greater than 4:1, or greater than 6:1. The condensation reaction typically occurs under an inert atmosphere and at room temperature upon mixing of the components.

The condensation reaction used to produce the precursor of Formula II (i.e., Reaction Scheme B) can occur in the presence or absence of a solvent. In some methods, no solvent or only a small amount of solvent is included in the reaction mixture. In other methods, a solvent may be included such as, for example, toluene, tetrahydrofuran, dichloromethane, or aliphatic hydrocarbons (e.g., alkanes such as hexane).

Removal of excess oxalate from the precursor of Formula II prior to reaction with the diamine in Reaction Scheme A tends to favor formation of an optically clear polydiorganosiloxane polyoxamide. The excess oxalate can typically be removed from the precursor using a stripping process. For example, the reacted mixture (i.e., the product or products of the condensation reaction according to Reaction Scheme B) can be heated to a temperature up to 150° C., up to 175° C., up to 200° C., up to 225° C., or up to 250° C. to volatilize the excess oxalate. A vacuum can be pulled to lower the temperature that is needed for removal of the excess oxalate. The precursor compounds of Formula II tend to undergo minimal or no apparent degradation at temperatures in the range of 200° C. to 250° C. or higher. Any other known methods of removing the excess oxalate can be used.

The by-product of the condensation reaction shown in Reaction Scheme B is an alcohol (i.e., $R^2$—OH is an alcohol). Group $R^2$ is often limited to an alkyl having 1 to 4 carbon atoms, a haloalkyl having 1 to 4 carbon atoms, or an aryl such as phenyl that form an alcohol that can be readily removed (e.g., vaporized) by heating at temperatures no greater than about 250° C. Such an alcohol can be removed when the reacted mixture is heated to a temperature sufficient to remove the excess oxalate of Formula IV.

The foregoing describes the invention in terms of embodiments foreseen by the inventor for which an enabling description was available, notwithstanding that insubstantial modifications of the invention, not presently foreseen, may nonetheless represent equivalents thereto.

EXAMPLES

These examples are merely for illustrative purposes only and are not meant to be limiting on the scope of the appended claims. All parts, percentages, ratios, and the like in the examples and are by weight, unless noted otherwise. Solvents and other reagents used were obtained from Sigma-Aldrich Chemical Company; Milwaukee, Wis. unless otherwise noted.

Table of Abbreviations

| Abbreviation or Trade Designation | Description |
|---|---|
| 5K PDMS diamine | A polydimethylsiloxane diamine with an average molecular weight of about 5,000 g/mole that was prepared as described in U.S. Pat. No. 5,214,119. |
| 14K PDMS diamine | Polydimethylsiloxane diamine with an approximate molecular weight of 14,000 g/mole that was prepared as described in U.S. Pat. No. 6,355,759. |
| 33K PDMS diamine | Polydimethylsiloxane diamine with an approximate molecular weight of 33,000 g/mole that was prepared as described in U.S. Pat. No. 6,355,759. |
| DMS-A12 | Polydimethylsiloxane diamine with an approximate molecular weight of 900 g/mole that was purchased from Gelest, Inc., Morrisville, PA |
| DMS-A15 | Polydimethylsiloxane diamine with an approximate molecular weight of 2,500 g/mole that was purchased from Gelest, Inc., Morrisville, PA |

-continued

Table of Abbreviations

| Abbreviation or Trade Designation | Description |
|---|---|
| THF | Tetrahydrofuran |
| EDA | Ethylene diamine |
| BDA | 1,4-butane diamine |
| HDA | 1,6-hexane diamine |
| XDA | m-xylene diamine |
| DHC-99 | 1,2-cyclohexane diamine, DuPont, Wilmington, DE |
| H12-MDA | 4,4'-bis(aminocyclohexyl)methane, Aldrich, Milwaukee, WI |
| EDR-148 | Triethyleneglycol diamine, Huntsman, The Woodlands, TX |
| DYTEK A | 2-methylpentane 1,5-diamine, DuPont, Wilmington, DE |

Test Methods

Hardness Testing

Shore A Hardness was measured according to ASTM D2240-5 Standard Test Method for Rubber Property-Durometer Hardness. This test method is based on the penetration of a specific type of indentor when forced into the material under specified conditions. The indentation hardness is inversely related to the penetration and is dependent on the elastic modulus and viscoelastic behavior of the material.

Titration Method to Determine Equivalent Weight

Approximately 10 grams (precisely weighed) of the precursor compound of Formula II was added to a jar. Approximately 50 grams THF solvent (not precisely weighed) was added. The contents were mixed using a magnetic stir bar mix until the mixture was homogeneous. The theoretical equivalent weight of precursor was calculated and then an amount of N-hexylamine (precisely weighed) in the range of 3 to 4 times this number of equivalents was added. The reaction mixture was stirred for a minimum of 4 hours. Bromophenol blue (10-20 drops) was added and the contents were mixed until homogeneous. The mixture was titrated to a yellow endpoint with 1.0N (or 0.1N) hydrochloric acid. The number of equivalents of precursor was equal to the number of equivalents of N-hexylamine added to the sample minus the number of equivalents of hydrochloric acid added during titration. The equivalent weight (grams/equivalent) was equal to the sample weight of the precursor divided by the number of equivalents of the precursor.

Color, Haze, and Luminous Transmittance Measurement

The luminous transmittance and haze of the samples were measured according to the American Society for Testing and Materials (ASTM) Test Method D 1003-95 ("Standard Test for Haze and Luminous Transmittance of Transparent Plastic") using a TCS Plus Spectrophotometer from BYK-Gardner Inc., Silver Springs, Md. Color measurements were made using the same instrument, following the CIE (French abbreviation for Commission of Lighting) established international color scale of L*, a*, b*.

Preparative Example 1

Diethyl oxalate (241.10 grams) was placed in a 3 liter, 3-neck resin flask equipped with a mechanical stirrer, heating mantle, nitrogen inlet tube (with stopcock), and an outlet tube. The flask was purged with nitrogen for 15 minutes and 5K PDMS diamine (2,028.40 grams, molecular weight equal to 4,918 g/mole) was added slowly with stirring. After 8 hours at room temperature, the reaction flask was fitted with a distillation adaptor and receiver. The contents were stirred and heated to 150° C. under vacuum (133 Pascals, 1 Torr) for 4 hours, until no further distillate was able to be collected. The remaining liquid was cooled to room temperature to provide 2,573 grams of a precursor of Formula II. Gas chromatographic analysis of the clear, mobile liquid showed that no detectable level of diethyl oxalate remained. Molecular weight was determined using $^1$H NMR (molecular weight equal to 5,477 grams/mole) and by titration (equivalent weights of 2,722 grams/equivalent and 2,721 grams/equivalent for two samples titrated).

Preparative Example 2

Diethyl oxalate (326.00 grams) was placed in a 2 liter, 3-neck resin flask equipped with a mechanical stirrer, heating mantle, nitrogen inlet tube (with stopcock), and an outlet tube. The flask was purged with nitrogen for 15 minutes and then, with vigorous stirring, DMS-A12 (497.50 grams) was added dropwise. This reaction mixture was stirred for approximately one hour at room temperature and then for 75 minutes at 80° C. The reaction flask was fitted with a distillation adaptor and receiver. The reaction mixture was heated to 120° C. under vacuum (133 Pascals, 1 Torr) for 2 hours, until no further distillate was able to be collected. The reaction mixture was cooled to room temperature to provide a precursor of Formula II. Gas chromatographic analysis of the clear, mobile liquid showed that no detectable level of diethyl oxalate remained. The ester equivalent weight was determined using $^1$H NMR (equivalent weight equal to 923 grams/equivalent) and by titration (equivalent weight equal to 910 grams/equivalent).

Preparative Example 3

A sample of DMS-A12 (500.00 grams) was placed in a 2 liter, 3-neck resin flask equipped with a mechanical stirrer, heating mantle, nitrogen inlet tube (with stopcock), and an outlet tube. The flask was purged with nitrogen for 15 minutes and then, with vigorous stirring, diethyl oxalate (324.76 grams) was added dropwise. This reaction mixture was stirred for approximately one hour at room temperature and then for 75 minutes at 80° C. The reaction flask was fitted with a distillation adaptor and receiver. The reaction mixture was heated under vacuum (133 Pascals, 1 Torr) for 2 hours at 120° C. and then 30 minutes at 130° C., until no further distillate was able to be collected. The reaction mixture was cooled to room temperature to provide a precursor of Formula II. Gas chromatographic analysis of the clear, mobile liquid showed that no detectable level of diethyl oxalate remained. The ester equivalent weight was determined using $^1$H NMR (equivalent weight equal to 1,293 grams/equivalent).

Preparative Example 4

A sample of DMS-A15 (500.00 grams) was placed in a 2 liter, 3-neck resin flask equipped with a mechanical stirrer, heating mantle, nitrogen inlet tube (with stopcock), and an outlet tube. The flask was purged with nitrogen for 15 minutes and then, with vigorous stirring, diethyl oxalate (116.92 grams) was added dropwise. This reaction mixture was stirred for approximately one hour at room temperature and then for 75 minutes at 80° C. The reaction flask was fitted with a distillation adaptor and receiver. The reaction mixture was heated under vacuum (133 Pascals, 1 Torr) for 2 hours at 120° C. and then 30 minutes at 130° C., until no further distillate was able to be collected. The reaction mixture was cooled to room temperature to provide a precursor of Formula II. Gas chromatographic analysis of the clear, mobile liquid showed that no detectable level of diethyl oxalate remained. The ester equivalent weight was determined using $^1$H NMR (equivalent weight equal to 1,788 grams/equivalent) and by titration (equivalent weight equal to 1,753 grams/equivalent).

Preparative Example 5

A sample of 14K PDMS diamine (830.00 grams, molecular weight 14,460 g/mole) was place in a 2 liter, 3-neck resin flask equipped with a mechanical stirrer, heating mantle, nitrogen inlet tube (with stopcock), and an outlet tube. The flask was purged with nitrogen for 15 minutes and then, with vigorous stirring, diethyl oxalate (33.56 grams) was added dropwise. This reaction mixture was stirred for approximately one hour at room temperature and then for 75 minutes at 80° C. The reaction flask was fitted with a distillation adaptor and receiver. The reaction mixture was heated under vacuum (133 Pascals, 1 Torr) for 2 hours at 120° C. and then 30 minutes at 130° C., until no further distillate was able to be collected. The reaction mixture was cooled to room temperature to provide a precursor of Formula II. Gas chromatographic analysis of the clear, mobile liquid showed that no detectable level of diethyl oxalate remained. The ester equivalent weight was determined using $^1$H NMR (equivalent weight equal to 7,916 grams/equivalent) and by titration (equivalent weight equal to 8,272 grams/equivalent).

Example 1

The precursor of Preparative Example 1 (793.20 grams) was placed in a 3 liter, 3-neck resin flask equipped with a mechanical stirrer, heating mantle, nitrogen inlet tube (with stopcock), and an outlet tube. The flask was purged with nitrogen for 15 minutes and hexane diamine (17.48 grams) was added. The mixture was mechanically stirred and heated to 150° C. under a nitrogen atmosphere for 3.5 hours. The viscous molten product was poured into a glass tray and allowed to cool. The polydimethylsiloxane polyoxamide was a clear, elastomeric slab having a Shore A hardness of 59.

The color, haze, and luminous transmittance properties were measured on a 24 micron thick melt-pressed sample. The luminous transmittance exceeded 91% for the wavelengths between 400 nm and 700 nm. The C2* percent haze value was 1.7 percent, and the A2* percent haze value was 1.6 percent. The L*, a*, b* values were respectively 97.15, 0.03, and 0.52.

Example 2

The precursor of Preparative Example 1 (100.00 grams) was placed in a 16-ounce wide mouth jar. EDA (1.0243 grams) was added. The jar was sealed and the mixture was rapidly agitated until the contents became too viscous to flow. After sitting overnight at ambient temperature, the solid product was dissolved in THF (200 grams). A film was cast by pouring the solution into a Petri dish and then by slowly evaporating the THF overnight at ambient temperature. The polydimethylsiloxane polyoxamide was a clear elastomeric film having a Shore A hardness of 55.

Example 3

The precursor of Preparative Example 1 (100.00 grams) was placed in a 16-ounce wide mouth jar. An aliquot of BDA (1.5025 grams) was added. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear elastomeric film having a Shore A hardness of 54.

Example 4

The precursor of Preparative Example 1 (100.00 grams) and HDA (2.0013 grams) were weighed into a 16-ounce jar. The jar was sealed and the mixture was rapidly agitated. The jar was place on a roller mill roller overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear elastomeric film having a Shore A hardness of 51.

Example 5

The precursor of Preparative Example 2 (100.00 grams) and EDA (3.33 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, flexible film (e.g., the film could be bent without breaking) having a Shore A hardness of 88.

Example 6

The precursor of Preparative Example 2 (100.00 grams) and XDA (7.55 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, flexible film (e.g., the film could be bent without breaking) having a Shore A hardness of 88.

Example 7

The precursor of Preparative Example 2 (10.00 grams) and EDR-148 diamine (0.81 grams) were weighed into an 8-dram vial. The vial was sealed and the mixture was rapidly agitated until the contents became too viscous to flow. The vial was placed on a roller mill overnight at ambient temperature. The product was heated to 130° C. and cast as a film within a glass Petri dish. The polydimethylsiloxane polyoxamide was a clear elastomeric film having a Shore A hardness of 85.

Example 8

The precursor of Preparative Example 2 (10.00 grams) and DYTEK A diamine (0.6380 grams) were weighed into an 8-dram vial. The vial was sealed and the mixture was rapidly agitated until the contents became too viscous to flow. The vial was placed on a roller mill overnight at ambient temperature. The product was heated to 130° C. and cast into a glass Petri dish. The polydimethylsiloxane polyoxamide was a clear elastomeric film having a Shore A hardness of 85.

Example 9

The precursor of Preparative Example 2 (10.00 grams) and DHC-99 (0.6274 grams) were weighed into an 8-dram vial. The vial was sealed and the mixture was rapidly agitated until the contents became too viscous to flow. The product was heated to 170° C. for one hour and then cast as a film within a glass Petri dish. The polydimethylsiloxane polyoxamide was a clear elastomeric film having a Shore A hardness of 76.

Example 10

The precursor of Preparative Example 2 (10.00 grams) and H12-MDA (1.1751 grams) were weighed into a vial. The vial was sealed and the mixture was rapidly agitated until the contents became too viscous to flow. The product was heated to 170° C. for one hour and then cast as a film within a glass Petri dish. The polydimethylsiloxane polyoxamide was a clear elastomeric film having a Shore A hardness of 81.

Example 11

The precursor of Preparative Example 3 (100.00 grams) and EDA (2.34 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, flexible film (e.g., the film could be bent without breaking) having a Shore A hardness of 78.

Example 12

The precursor of Preparative Example 3 (100.00 grams) and XDA (5.32 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, flexible film (e.g., the film could be bent without breaking) having a Shore A hardness of 78.

Example 13

The precursor of Preparative Example 4 (100.00 grams) and EDA (1.73 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, leathery film having a Shore A hardness of 75.

Example 14

The precursor of Preparative Example 4 (100.00 grams) and XDA (3.92 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, leathery film having a Shore A hardness of 72.

Example 15

The precursor of Preparative Example 1 (100.00 grams) and XDA (2.32 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear elastomeric film having a Shore A hardness of 60.

Example 16

The precursor of Preparative Example 5 (98.13 grams) and EDA (0.36 grams) were weighed into a 16-ounce jar. The jar was sealed and the mixture was stirred agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, elastomeric film having a Shore A hardness of 38.

Example 17

The precursor of Preparative Example 5 (100.00 grams) and XDA (0.83 grams) were weighed into a 16-ounce jar. The jar was sealed and the mixture was rapidly agitated until the contents became too viscous to flow. The jar was placed on a roller mill overnight at ambient temperature. The solid product was dissolved in THF (200 grams). A film was cast by pouring the solution into a Petri dish and then by slowly evaporating the THF overnight at ambient temperature. The polydimethylsiloxane polyoxamide was a clear, elastomeric film having a Shore A hardness of 33.

Example 18

The precursor of Preparative Example 1 (150.00 grams) was charged into a 2 liter, 3-neck resin flask equipped with a mechanical stirrer, heating mantle, nitrogen inlet tube (with stopcock), and an outlet tube. With vigorous stirring at ambient temperature, BDA (2.5767 grams) was added dropwise. This reaction mixture was stirred at ambient temperature until the viscosity became too high to mix, and then the mixture was heated to 175° C. with stirring for one hour. The viscous, molten product was cast as a slab by pouring the mixture into a glass baking dish and cooling to room temperature. The clear elastomeric slab had a Shore A hardness of 61.

Example 19

The precursor of Preparative Example 2 (10.00 grams) and hexane (16.10 grams) were weighed into a 4-ounce jar and mixed until homogeneous. An aliquot of XDA (0.7559 grams) was added and the mixture was stirred rapidly for about 2 minutes. A film was cast by pouring the solution into a Petri dish and then by slowly evaporating the hexane overnight. The polydimethylsiloxane polyoxamide was a clear, flexible film (e.g., the film could be bent without breaking) having a Shore A hardness of 79.

Example 20

A sample of 33K PDMS diamine (15.00 grams) was place in a reaction vessel. The PDMS diamine was degassed by heating to 100° C. under vacuum for about 30 minutes and then cooled to ambient temp. Toluene (138.00 grams) was added to the PDMS diamine and the resulting mixture was mixed until homogeneous. Di(trifluorethyl) oxalate (0.4666 gram) was added and the mixture was stirred for 90 minutes at ambient temp. A homogeneous mixture of HDA (0.1615 gram) and toluene (3.00 grams) was added and the resulting mixture was agitated on a roller mill. After 4 days, the contents had solidified to a clear gel. Isopropyl alcohol (16.20 grams) was added and the mixture was heated in a 55° C. oven until a fluid solution was obtained, and then poured into a Petri dish. The solvents were allowed to evaporate slowly overnight at ambient temperature. The polydimethylsiloxane polyoxamide was a clear elastomeric film having a Shore A hardness of 14.

Example 21

Precursor of Preparative Example 1 (equivalent weight of 3,399) was reacted with EDA, using a continuous, solventless, ambient temperature process, which generated solid polymeric material in several minutes. Gear pumps were used to continuously meter co-reactant feed streams, and static mixers were utilized to accomplish mixing. The mixed feed stream was dispensed into receptacles such as jars, trays or molds, prior to formation of solid polymer product. Two gear pumps, each mounted on a pump cart equipped with a drive motor, digital rpm readout, nitrogen purged reservoir tank (EDA only) and flexible high density polyethylene tubing lines (0.635 centimeter outer diameter for precursor and 0.317 centimeter outer diameter for EDA), were used to deliver a continuous precursor feed stream of 34.74 grams/minute, and an EDA feed stream of 0.31 gram/minute, at a back pressure greater than 76 kiloPascals. During flow calibration, each feed line was equipped with a flow restrictor needle valve and back pressure gauge. The two co-reactant streams were combined in a stainless T-shaped feedblock, and the resulting blend was mixed via static mixer (20.3 centimeter length, 0.95 centimeter diameter and 24 elements). The mixed stream was dispensed into jars and other receptacles. Solid polymeric material was formed within several minutes (e.g., 2 minutes). Titration of reaction product for these co-reactants confirmed that about 99 percent reaction conversion was achieved after one hour or less, and that additional curing occurred at ambient temperature.

Example 22

A sample of the polymer prepared in Example 1 (25 grams) was cut into rectangular strips. These strips were loaded into a hot glue gun that was obtained from 3M under the trade designation POLYGUN TC (#B93745, 150 watts, 60 CPS). The gun was plugged in and allowed to heat-up for about 10 minutes. The temperature inside the barrel was 200° C. The molten polymer was extruded from the gun as a thin bead onto one end of a 10 centimeter by 10 centimeter (4 inch×4 inch) glass coupon. While still molten, a second glass coupon was pressed down firmly onto the bead, which caused it to spread out as a thin film between the two pieces of glass. This overlapping bond had an area of 10 centimeters by 4 centimeters (4 inches×1.6 inches). A similar bond was formed between two 18 centimeter by 7.6 centimeter (7 inches×3 inches) softwood coupons. The bond area of the wood was 7.6 centimeters by 8.25 centimeters (3 inches× 3.25 inches). These bonded panels were allowed to sit for several weeks, at which time it was attempted to pull them apart. Neither bond could be pulled apart by hand in the tensile mode.

The invention claimed is:

1. A compound of Formula II:

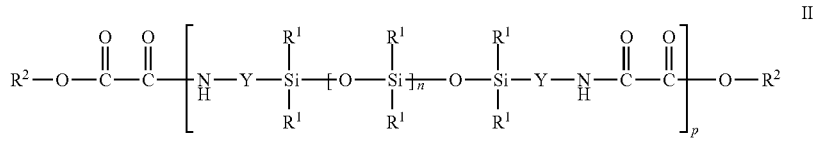

wherein
 each $R^1$ is independently an alkyl, haloalkyl, aralkyl, alkenyl, aryl, or aryl substituted with an alkyl, alkoxy, or halo;
 each $R^2$ is independently a phenyl or a phenyl substituted with an alkyl having 1 to 4 carbon atoms, with an alkoxy having 1 to 4 carbon atoms, with a halo, or with an alkoxycarbonyl having 2 to 5 carbon atoms;
 each Y is independently an alkylene, aralkylene, or a combination thereof;
 each n is independently an integer of 0 to 1500; and
 p is an integer of 1 to 10.

2. The compound of claim 1, wherein $R^1$ is methyl.

3. The compound of claim 1, wherein at least 50 percent of the $R^1$ groups are methyl.

4. The compound of claim 1, wherein each Y is an alkylene having 1 to 10 carbon atoms, phenylene bonded to an alkylene having 1 to 10 carbon atoms, or phenylene bonded to a first alkylene having 1 to 10 carbon atoms and to a second alkylene having 1 to 10 carbon atoms.

5. The compound of claim 1, wherein n is an integer of 0 to 500.

6. The compound of claim 1, wherein p is an integer of 1 to 4.

7. A composition comprising:
 a) at least one first compound of Formula IIa; and

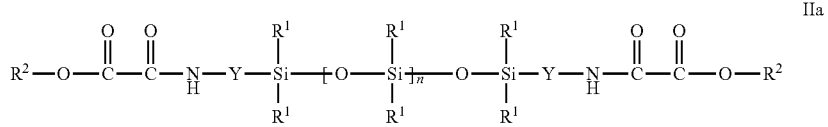

b) at least one second compound of Formula II

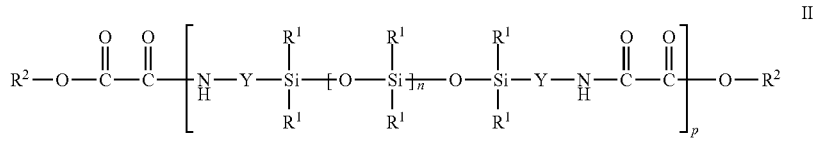

wherein
 Formula IIa is the compound of Formula II wherein p=1, and wherein
 each $R^1$ is independently an alkyl, haloalkyl, aralkyl, alkenyl, aryl, or aryl substituted with an alkyl, alkoxy, or halo;
 each $R^2$ is independently an alkyl, haloalkyl, aryl, or aryl substituted with an alkyl, alkoxy, halo, or alkoxycarbonyl;
 each Y is independently an alkylene, aralkylene, or a combination thereof;
 each n is independently an integer of 0 to 1500; and
 p is an integer of 2 to 10.

8. The composition of claim 7, wherein $R^1$ is methyl.

9. The composition of claim 7, wherein each $R^2$ is an alkyl having 1 to 4 carbon atoms or a haloalkyl having 1 to 4 carbon atoms, the alkyl or haloalkyl having a primary carbon atom or secondary carbon atom bonded to the adjacent oxy group.

10. The composition of claim 7, wherein each $R^2$ is a phenyl or a phenyl substituted with an alkyl having 1 to 4 carbon atoms, with an alkoxy having 1 to 4 carbon atoms, with a halo, or with an alkoxycarbonyl having 2 to 5 carbon atoms.

11. The composition of claim 7, wherein each Y is an alkylene having 1 to 10 carbon atoms, phenylene bonded to an alkylene having 1 to 10 carbon atoms, or phenylene bonded to a first alkylene having 1 to 10 carbon atoms and to a second alkylene having 1 to 10 carbon atoms.

12. The composition of claim 7, wherein the composition comprises at least 50 weight percent of the first compound of Formula II and no greater than 50 weight percent of the second compound of Formula III based on the sum of the weight of the first and second compounds in the mixture.

13. A method of making a composition comprising:
a) at least one first compound of Formula IIa, and

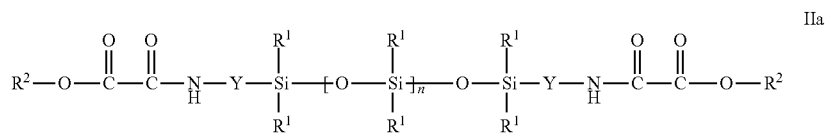

b) at least one second compound of Formula II

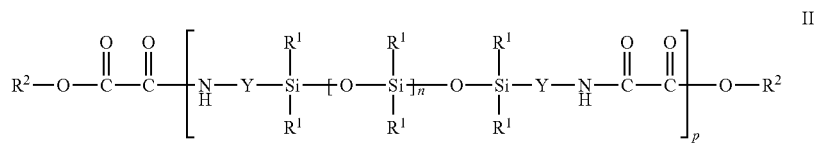

the method comprising mixing a polydiorganosiloxane diamine of Formula III

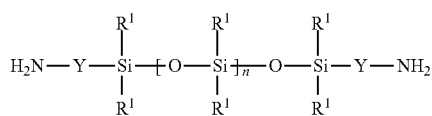

with a molar excess of an oxalate of Formula IV,

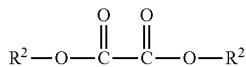

wherein
Formula IIa is the compound of Formula II wherein p=1, and wherein
each $R^1$ is independently an alkyl, haloalkyl, aralkyl, alkenyl, awl, or aryl substituted with an alkyl, alkoxy, or halo;

each $R^2$ is independently an alkyl, haloalkyl, awl, or aryl substituted with an alkyl, alkoxy, halo, or alkoxycarbonyl;
each Y is independently an alkylene, aralkylene, or a combination thereof;
each n is independently an integer of 0 to 1500; and
p is an integer of 2 to 10.

14. The method of claim 13, wherein each $R^2$ is an alkyl having 1 to 4 carbon atoms or a haloalkyl having 1 to 4 carbon atoms, the alkyl or haloalkyl having a primary carbon atom or secondary carbon atom bonded to the adjacent oxy group.

15. The method of claim 13, wherein each $R^2$ is a phenyl or a phenyl substituted with an alkyl having 1 to 4 carbon atoms, with an alkoxy having 1 to 4 carbon atoms, with a halo, or with an alkoxycarbonyl having 2 to 5 carbon atoms.

16. The method of claim 13, further comprising removing the excess oxalate after reaction of the polydiorganosiloxane diamine and the oxalate.

17. The method of claim 13, wherein the two $R^2$ groups of the oxalate of Formula IV are different.

18. The method of claim 13, wherein $R^1$ is methyl.

* * * * *

UNITED STATES PATENT AND TRADEMARK OFFICE
CERTIFICATE OF CORRECTION

PATENT NO. : 9,434,821 B2
APPLICATION NO. : 14/933543
DATED : September 6, 2016
INVENTOR(S) : Charles Leir It is certified that error appears in the above-identified patent and that said Letters Patent is hereby corrected as shown below:

On the Title Page

Column 2 (Abstract)
Line 5, Delete "oxalyamino" and insert -- oxalylamino --, therefor.

In the Specification

Column 9
Line 5, Delete "polydiorganosilocane" and insert -- polydiorganosiloxane --, therefor.
Line 16, Delete "60/753,791" and insert -- with Ser. No. 60/753,791, Attorney Docket No. 61494US002 --, therefor.

Column 11
Line 9, Delete "polyoxypropropylene" and insert -- polyoxypropylene --, therefor.

Column 12
Line 53, Delete "effect" and insert -- affect --, therefor.

Column 14
Line 42, After "application" delete "with".

Column 24
Line 22, Delete "Di(trifluorethyl)" and insert -- Di(trifluoroethyl) --, therefor.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*